(12) United States Patent
Boulanger et al.

(10) Patent No.: US 11,697,591 B2
(45) Date of Patent: Jul. 11, 2023

(54) METHOD FOR PRODUCING CARBON NANOTUBES ATTACHED TO A SUBSTRATE

(71) Applicant: NawaTechnologies, Aix-en-Provence (FR)

(72) Inventors: Pascal Boulanger, Eguilles (FR); Thomas Goislard de Monsabert, Saint-Maximin-la Sainte-Baume (FR)

(73) Assignee: Nawa Technologies, Aix-en-Provence (FR)

(*) Notice: Subject to any disclaimer, the term of this patent is extended or adjusted under 35 U.S.C. 154(b) by 576 days.

(21) Appl. No.: 16/626,029

(22) PCT Filed: Jun. 20, 2018

(86) PCT No.: PCT/FR2018/051474
§ 371 (c)(1),
(2) Date: Jan. 23, 2020

(87) PCT Pub. No.: WO2019/002721
PCT Pub. Date: Jan. 3, 2019

(65) Prior Publication Data
US 2020/0148539 A1    May 14, 2020

(30) Foreign Application Priority Data

Jun. 26, 2017    (FR) ...................... 1755818

(51) Int. Cl.
*C01B 32/162*    (2017.01)
*C01B 32/05*    (2017.01)
(Continued)

(52) U.S. Cl.
CPC ............ *C01B 32/162* (2017.08); *C01B 32/05* (2017.08); *C23C 16/26* (2013.01); *D01F 9/127* (2013.01); *D01F 9/133* (2013.01)

(58) Field of Classification Search
CPC ..... C01B 32/162; C01B 32/05; C01B 32/164; C01B 32/158; C01B 32/159; C01B 32/16;
(Continued)

(56) References Cited

U.S. PATENT DOCUMENTS

2005/0006801 A1*  1/2005  Kinloch ................. B82Y 40/00
                                                        435/182
2013/0196156 A1*  8/2013  Koziol .................... C08F 36/20
                                                        427/221
(Continued)

FOREIGN PATENT DOCUMENTS

WO    WO-2005-007926        1/2005
WO    WO 2011/138595    *  11/2011    ............... C08K 9/04
(Continued)

OTHER PUBLICATIONS

Husairi, et al., Electrical properties of carbon nanotubes synthesis by double furnace thermal-CVD technique at different termperatures on porous silicon template, 2013 IOP Conv. Ser.: Mater. Sci. Eng. 46: Jan. 20, 2023, pp. 1-7 (Year: 2013).*

*Primary Examiner* — Daniel C. McCracken
(74) *Attorney, Agent, or Firm* — Greenberg Traurig, LLP

(57) ABSTRACT

A method for preparing carbon nanotubes, nanofibres or nanofilaments by decomposition of at least one carbon precursor in the presence of a catalyst, in which method continuously:—a first gas stream comprising a precursor of a catalyst is brought into contact with a porous substrate (43);—a second gas stream comprising at least one carbon precursor is brought into contact with said porous substrate (43);—said porous substrate (43) is heated to a temperature leading to the deposition of catalyst particles and to the catalytic growth of carbon nanotubes.

10 Claims, 8 Drawing Sheets

Figure 1:
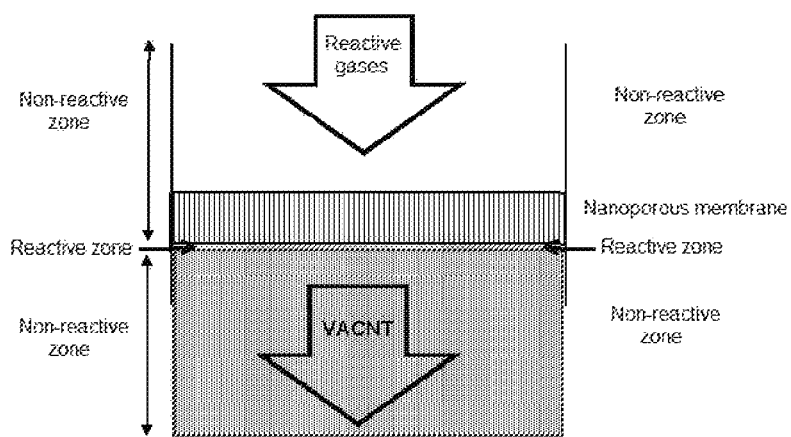

(51) Int. Cl.
*C23C 16/26* (2006.01)
*D01F 9/127* (2006.01)
*D01F 9/133* (2006.01)

(58) Field of Classification Search
CPC ..... C01B 32/166; C01B 32/168; C01B 32/17; C01B 32/172; C01B 32/174; C01B 32/176; C01B 32/178; C01B 2202/00; C01B 2202/02; C01B 2202/04; C01B 2202/06; C01B 2202/08; C01B 2202/10; C01B 2202/20; C01B 2202/22; C01B 2202/24; C01B 2202/26; C01B 2202/28; C01B 2202/30; C01B 2202/32; C01B 2202/34; C01B 2202/36; C23C 16/26; D01F 9/127; D01F 9/133; D01F 9/12; D01F 9/1271; D01F 9/1272; D01F 9/1273; D01F 9/1274; D01F 9/1275; D01F 9/1276; D01F 9/1277; D01F 9/1278
See application file for complete search history.

(56) References Cited

U.S. PATENT DOCUMENTS

| 2016/0289826 | A1* | 10/2016 | Boulanger | B01J 19/22 |
| 2017/0327378 | A1* | 11/2017 | Pick | C01B 32/162 |
| 2019/0367369 | A1* | 12/2019 | Bulmer | C01B 32/17 |

FOREIGN PATENT DOCUMENTS

| WO | WO-2011-138595 | | 11/2011 | |
| WO | WO 2015/082936 | * | 6/2015 | B01J 19/08 |
| WO | WO-2015-082936 | | 6/2015 | |
| WO | WO 2005/007926 | * | 6/2016 | C23C 16/44 |
| WO | WO 2016/087857 | * | 6/2016 | C01B 31/02 |
| WO | WO-2016-087857 | | 6/2016 | |
| WO | WO 2018/134245 | * | 7/2018 | C01B 32/158 |
| WO | WO-2018-134245 | | 7/2018 | |

\* cited by examiner

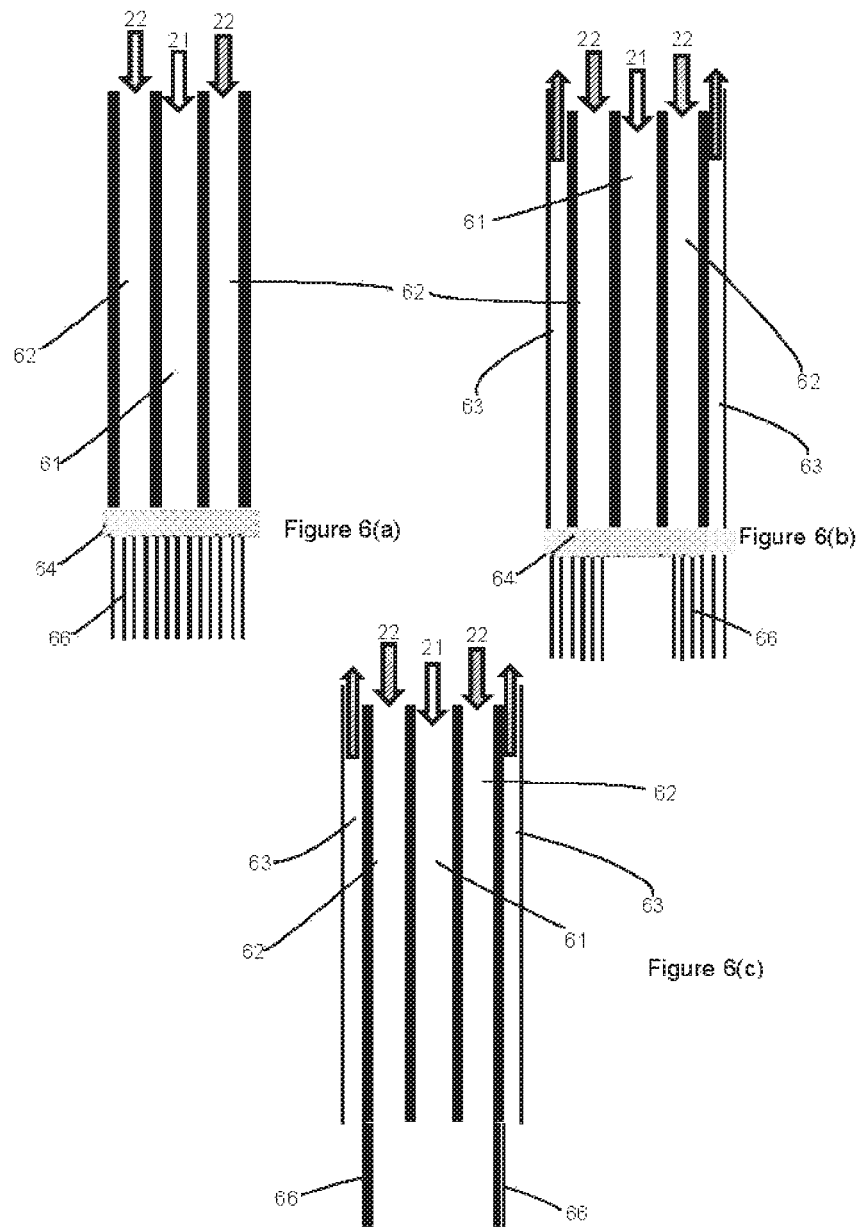

METHOD FOR PRODUCING CARBON NANOTUBES ATTACHED TO A SUBSTRATE

RELATED APPLICATIONS

The present application is a national phase filing under 35 USC 371 of International Application No. PCT/FR2018/051474, filed on Jun. 20, 2018, claiming priority to FR Application No. 1755818, filed on Jun. 26, 2017. The contents of International Application No. PCT/FR2018/051474, filed on Jun. 20, 2018 are incorporated by reference.

TECHNICAL FIELD OF THE INVENTION

The invention relates to the field of nanotubes made of carbon, and more particularly relates to a new method for producing carbon nanotubes by catalytic decomposition of a carbon precursor compound. This synthesis is carried out on a porous substrate that is passed through by a gas stream that continuously supplies a catalyst precursor that is deposited on this substrate.

PRIOR ART

Many methods are known for the deposition of carbon nanotubes or nanofibers. Most proceed through catalytic decomposition of a carbon precursor gas on a substrate. The catalyst can be supplied by the substrate (where it was deposited beforehand), or by the gas phase. The growth is always limited by the progressive deactivation of the catalyst.

It is well known to those skilled in the art that the growth of carbon nanotubes on a catalytic substrate is limited (see for example: "Carbon Nanotube Synthesis and Growth Mechanism", Chapter 8, by M. Kumar, DOI: 10.5772/19331, intechopen.com).

The article of Kumar presents the two growth models that are most often used for carbon nanotubes. These two models start with the deposition of a catalyst particle on a substrate. In the first model called "tip-growth model" this particle weakly interacts with the substrate, and the growth of the nanotube proceeds through carbon generated by the catalytic decomposition of a hydrocarbon gas above the particle, with the carbon diffusing to the base of the particle and forming below the particle the carbon nanotube that raises said particle; however, the catalytic particle is progressively deactivated by the formation of a layer of carbon on the upper portion thereof or by progressive loss of material. In the second model called "base growth model" the particle interacts strongly with the substrate, and the growth of the nanotube proceeds through carbon generated by catalytic decomposition of a hydrocarbon gas at the base of the particle, with the carbon diffusing to the top of the particle and forming above the particle the carbon nanotube; however, the catalytic particle is progressively deactivated by loss of chemical reactivity or by progressive loss of material.

Vertically aligned nanotubes (VACNT) are also known. VACNT are formed of carbon nanotubes of which the diameter is between a few nanometers and a few tens of nanometers. The method of synthesis of VACNT consists in a heterogeneous catalytic decomposition of gas precursors on catalytic particles (catalytic CVD) which are located at the interface between the substrate and the base of the carbon nanotubes ("base growth mechanism"). The length (thickness of the mat) typically reaches a few hundred micrometers, but can reach up to several millimeters; the length of the nanotubes is limited by two phenomena: The deactivation or the progressive disaggregation of the catalytic particles during the course of the method of synthesis of nanotubes, and the progressive increase in the resistance to the diffusion of the gas precursors to the base of the nanotubes and to the removal of the reaction by-products to the top of the nanotubes. In reality most often observed is a logarithmic decrease in the growth of vertically aligned nanotubes over time (see for example: Jourdain and Bichara, Carbon 58 (2013) p. 2-39).

It has been demonstrated that the first of these two difficulties can be overcome by introducing the catalyst continuously into the reactor: document EP 1 515 911 describes a method in which a catalyst precursor in the form of an aerosol is introduced into the reactor, by periodic injection all throughout the duration of the synthesis of the nanotubes; this method makes it possible to obtain vertically aligned carbon nanotubes that are deposited on a heated substrate or on the inner walls of the reactor. In this method the catalyst is renewed on a regular basis. In practice, the length of the nanotubes that can be obtained by this method is however limited by the diffusion of the gas precursors and of the gas by-products: a length of approximately one millimeter is not exceeded. This is sufficient for many applications, but it is desired to be able to produce loner nanotubes fixed on a substrate.

The problem that the present invention seeks to resolve is therefore to present a new method that makes it possible to produce nanofibers or nanotubes of substantial length (preferably at least centimetrical), fixed on a substrate, and preferably aligned perpendicularly to this substrate.

OBJECTS OF THE INVENTION

The method according to the invention comprises the deposition of carbon nanotubes by catalytic decomposition of a carbon precursor. According to the invention, the reaction zone is constantly and simultaneously supplied with catalytic nanoparticles and with carbon precursor. This makes it possible to overcome a first known problem of methods for the deposition of carbon nanotubes or nanofibers, namely the disappearance or the deactivation of the catalyst: the catalyst that has become inactive or that has disappeared by disaggregation (i.e. that has been progressively driven in the body of the nanotubes during the growth thereof) is replaced all throughout the method.

According to the invention, the carbon precursor is supplied directly in the vicinity of the catalytic particles, or more precisely in the vicinity of the zone of the substrate in which said catalytic particles are deposited. This makes it possible to overcome a second known problem of methods for the deposition of carbon nanotubes or nanofibers, namely the progressive stopping of the growth of nanotubes by blocking of the diffusion of the precursors and of secondary products. In particular, a configuration is chosen in which the stream of reagents (catalyst precursor particles and carbon precursor) is no longer opposed to the stream of by-products. This configuration of the stream is carried out using a porous substrate wherein or whereon the catalytic particles are deposited.

According to the invention the problem is therefore resolved by a method that combines several means:

The first means is a porous substrate that is brought into contact with the catalyst particles. The second means is the supply of a first gas stream comprising a catalyst or a precursor compound of a catalyst. The carbon source compound can be supplied by this first gas stream and/or by a second gas stream; this second gas stream can be spatially separated from said first gas stream. The third means is the supply of this first gas stream, and if present, of said second gas stream in the vicinity of said porous substrate. The fourth means is the deposition of the catalyst in said porous substrate or on a surface of said porous substrate or in the vicinity of said porous substrate, and the catalytic decomposition of the carbon source compound on this deposited catalyst.

In an advantageous embodiment, the reaction zone, i.e. the zone where the catalytic decomposition of the carbon source compound takes place, is confined to the zone where the catalytic particles are deposited. This confinement can be carried out in various ways. It is possible to heat the porous substrate and supply at least one of the reactive gases, or all of the reactive gases, locally. It is also possible to heat the porous substrate locally. In an embodiment these two means are combined, namely the localized supplying with reactive gas or gases and the localized heating.

A first object of the invention is a method for preparing carbon nanotubes, nanofibers or nanofilaments by decomposition of at least one carbon precursor in the presence of a catalyst, in which method continuously:

a first gas stream comprising a precursor of a catalyst is brought into contact with a porous substrate;

a second gas stream comprising at least one carbon precursor is brought into contact with said porous substrate;

said porous substrate is heated to a temperature leading to the deposition of catalyst particles and to the catalytic growth of carbon nanotubes. This temperature is preferably between 500° C. and 1,000° C., Advantageously, said porous substrate is passed through at least partially by said first gas stream, and/or said first gas stream is directed on a surface zone of said porous substrate. Said first gas stream and said second gas stream can be represented by the same gas stream mixture. Said porous substrate is heated locally in the zone through which said first gas stream leaves the substrate, or in the zone on which is directed said first gas stream. The localized heating can be carried out by induction. Each one of these characteristics makes it possible to provide the confinement of the reaction zone wherein the catalyst particles are deposited.

Said carbon precursor can be a hydrocarbon or can comprise a hydrocarbon; this hydrocarbon is preferably acetylene. Carbon monoxide can also be used.

In an advantageous embodiment said first gas stream is generated from an aerosol comprising a metallo-organic compound in a carrier gas. Said aerosol can be generated by periodic injection of a liquid phase comprising said metalloorganic compound in a carrier gas.

Said metallo-organic compound can be selected in the group formed by ferrocene, cobaltocene, nickelocene.

Said porous substrate is advantageously selected from the group formed by: porous silicon, porous alumina, porous silicon carbide, metallic foams that have interconnected pores, carbon foams that have interconnected pores, vertically aligned carbon nanotubes, mixed substrates comprising several of the preceding substrates. It can be a porous membrane.

Another object of the invention is a reactor for the implementing of the method according to the invention, comprising, following the direction of the flow of the gas stream:

A zone for injecting a stream of reactant gas provided with first means of heating capable of heating the gases to a temperature T2 comprised between 250° C. and 450° C., A porous substrate travelled through by said stream of reactant gas, A zone provided with second means of heating capable of heating at least one portion of said porous substrate to a temperature T3 comprised between 450° C. and 700° C., A tubular deployment zone capable of allowing for the deployment of the nanofibers or nanotubes formed, An outlet through which the gases can exit said reactor.

The reactor can comprise means for supplying a first stream of reactive gas comprising a precursor of a catalyst and a second stream of reactant gas comprising at least one carbon precursor. Said means for supplying a first and second stream of reactive gas can comprise a reservoir for each one of the first and second reactive gases.

The reactor can comprise means of confinement of the catalytic decomposition zone of the carbon precursor.

The reactor can further comprise means for collecting said nanofibers or nanotubes.

Said second means of heating are preferably means of localized heating, i.e. means that are capable of locally heating at least one portion of said porous substrate. Consequently, during the operation of the reactor, advantageously said at least one portion of the porous substrate is, by the heating effect of said means of localized heating, at a temperature that is higher than that of the stream of reactive gas that enters into said porous substrate. These means of localized heating can act as means of confinement of the zone of catalytic decomposition of the carbon precursor.

In an embodiment, the reactor comprises, preferably in said zone of deployment, third means of heating capable of heating the nanotubes or nanofibers formed to a temperature T4 comprised between 800° C. and 2,000° C. This can improve the crystallinity of the nanofibers or nanotubes formed.

FIGURES

FIGS. 1 to 6 show various aspects of the invention.

FIGS. 1 and 2 diagrammatically show the principle of the method according to the invention.

FIG. 3 diagrammatically shows two means of confinement of the heating in the vicinity of the outlet surface of the porous substrate.

FIG. 4 diagrammatically shows two alternatives of the device according to the invention.

FIG. 5 diagrammatically shows two alternatives of the method according to the invention.

FIG. 6 diagrammatically shows three embodiments of the invention with a coaxial injection nozzle.

DESCRIPTION

The present invention has several essential characteristics, and other characteristics that are only optional.

According to the invention a method of chemical vapor deposition is used from one or several hydrocarbon compounds acting as carbon precursors (also called here "source of carbon"), said chemical vapor deposition being catalyzed by catalytic particles. Said catalytic particles are deposited on the porous substrate, or formed on said porous substrate. They come from a precursor compound of a catalyst that is supplied by a first gas stream; this represents a first essential characteristic of the invention. In an advantageous embodiment said precursor compound of a catalyst is introduced into said first gas stream in the form of finely divided liquid or solid particles; in other words said first gas stream comprises at least in one portion of its travel an aerosol (also called here "catalyst aerosol"). The introduction of the catalyst precursor compound in the form of an aerosol comprising solid and/or liquid particles of said catalyst precursor compound represents a very highly preferred embodiment of the method according to the invention. In other embodiments said precursor compound of a catalyst is introduced into the first gas stream in gaseous form.

According to another essential characteristic of the invention the reactive gases are brought into contact with a porous substrate. The term "reactive gas" designates here the first gas stream, i.e. on the one hand, the catalyst aerosol and the gas phase that results from the evaporation and/or decomposition, partial or total, of said particles during the conveyance thereof to said porous substrate, and, on the other hand, the source of carbon compound or compounds, possibly in the carrier gas thereof, knowing that the source of carbon compound or compounds can be part of said first gas stream, and/or can be part of a second gas stream. The bringing into contact of the reactive gases with the porous substrate can be carried out in a common stream or in separate streams, for example a first stream coming from the catalyst aerosol and a second stream that comprises the carbon source compound. It is understood that the catalyst precursor can also be a source of carbon, i.e. the organic portion of the organo-metallic molecule can be used, after decomposition of the molecule, as a source of carbon, and/or the solvent of said organo-metallic molecule, if a solvent is used, can be used as a source of carbon.

In an embodiment shown diagrammatically in FIG. 1, the porous substrate is a membrane, and it is passed through by a stream of reactant gas. This results in the spatial confinement of the reactive gas stream. This membrane can in particular be microporous, meso-porous and/or nanoporous.

According to another essential characteristic of the invention energy is supplied to the reactive gases so as to allow for the growth of carbon nanotubes or nanofibers. This supplying of energy can be carried out in a confined zone. In an embodiment shown diagrammatically in FIG. 1 this confinement is carried out in a zone close to the surface of the nanoporous membrane. Thus, the chemical reactions that lead to the growth of nantotubes or nanofibers take place in a confined zone.

According to another essential characteristic of the invention the stream of reactive gases is supplied continuously, allowing for the uninterrupted growth of nanotubes or nanowires. In the embodiment shown diagrammatically in FIG. 1 this growth leads to a mat of VANCT of great length, forming a bundle.

Figure 2A:
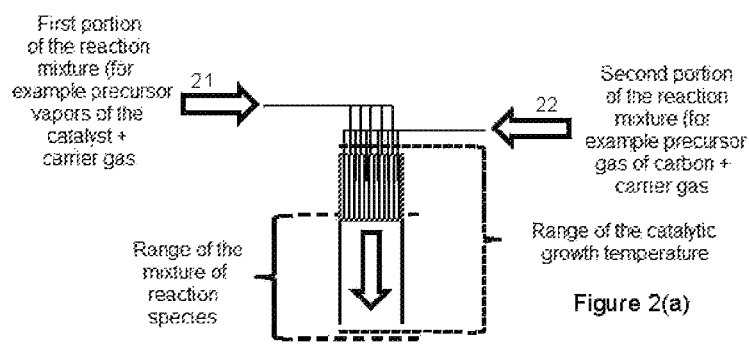
Figure 2B:
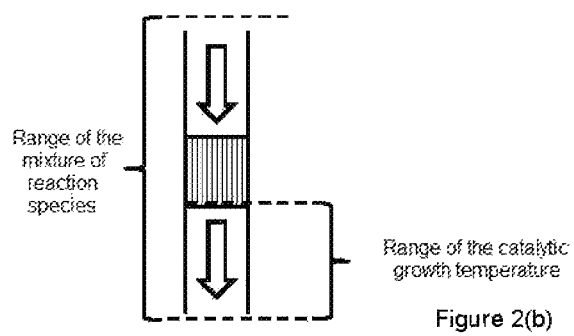
Figure 2C:
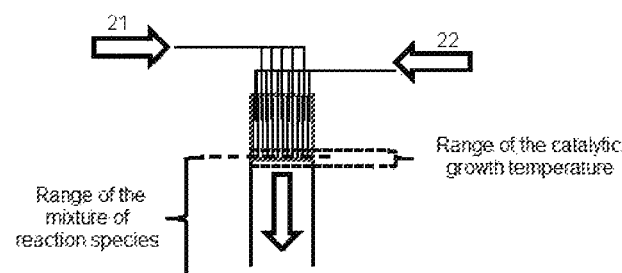

FIG. 2 diagrammatically shows the role of the confinement of the energy supply. FIG. 2(a) shows a porous substrate passed through by a first gas stream 21 and by a second gas stream 22; these two gas streams are mixed within a confined zone of the substrate, in a heated enclosure. The mode of heating of the substrate does not generate any confinement of the heating within the substrate. FIG. 2(b) shows a porous substrate passed through by a single gas stream with a localized thermal energy supply downstream from the porous substrate which heats the substrate only in a zone of low thickness near the outlet thereof. FIG. 2(c) shows the same configuration, but with an energy supply confined in a zone of low thickness close to the outlet of the porous substrate.

Figures 3A, 3B:
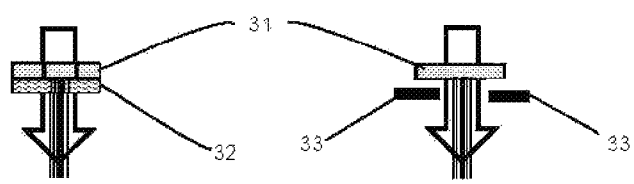
Figure 4A:
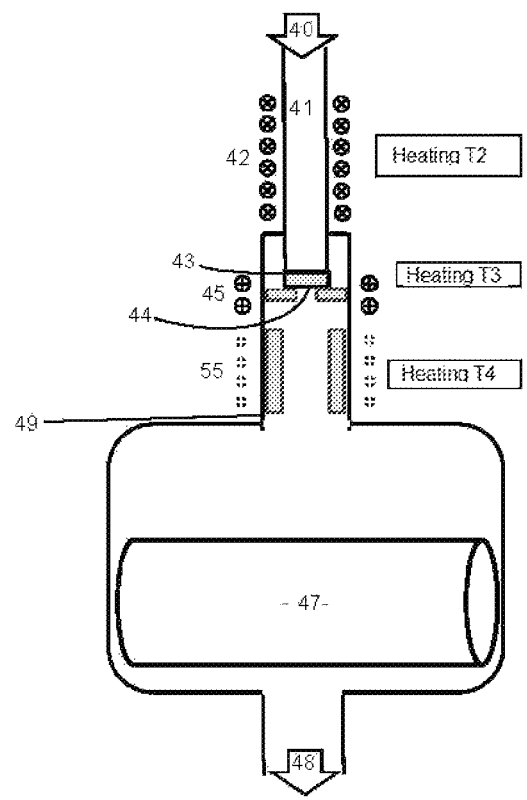

FIG. 3 diagrammatically shows two embodiments for carrying out a localized heating of the substrate by induction: with a metallic foam fixed at the outlet of the porous substrate (FIG. 4(a)) and with a metallic ring at the outlet of the porous substrate (FIG. 3(b)).

FIG. 4 diagrammatically shows four partial cross-section view of reactors that are suitable for implementing the invention.

1. The Reagents

The first gas stream initially comprises the catalyst aerosol, which comprises particles that comprise a catalyst precursor metal compound, said particles being conveyed by a carrier gas. This carrier gas can comprise a carbon precursor hydrocarbon compound, or it can be inert in the reaction conditions chosen (it can be for example a hydrocarbon compound that does not catalytically decompose in the reaction conditions chosen, or it can be nitrogen or hydrogen). Said particles comprising a catalyst precursor metal compound can be produced from a liquid (at the temperature T1 at which said liquid is at the moment when it is conveyed into the device for forming aerosol) which is formed by said catalyst precursor metal compound, if this compound is a liquid, or by a solution of said catalyst precursor metal compound in a liquid solvent. Said liquid solvent can be a carbon precursor hydrocarbon compound, or it can be a compound that is not decomposed in the reaction conditions of catalytic decomposition on the porous substrate. Advantageously the catalyst aerosol initially comprises liquid particles. The catalyst aerosol can be formed by periodic injection of a liquid phase (being at the temperature T1) in a carrier gas. An injection pump of the current type such as is used in combustion engines can be used.

During the conveyance thereof to the porous substrate these liquid particles (with the temperature in this zone of the reactor being named here T2) can evaporate partially or entirely; in particular, the solvent thereof can evaporate partially or entirely, and the particle forming the catalyst aerosol can become a solid particle formed from the precursor metal compound of a catalyst, or can evaporate. During the conveyance thereof to the porous substrate these liquid or solid particles or these gas molecules (with the temperature in this zone of the reactor being named here as T3) can be decomposed partially or entirely, in particular by pyrolysis, thus releasing the metallic catalyst that they contain. The details of the decomposition of the particles that form the catalyst aerosol or catalytic precursor gas molecules, and of the formation of catalyst particles on the porous substrate or in the porous substrate are not known by the inventors, and they do not wish to be bound by the theoretical representations that they make of this portion of the method according to the invention.

Said carbon precursor hydrocarbon compound can be supplied by said first gas stream (where it can act as a carrier gas of the aerosol), and/or it can be supplied by other gas streams (for example by said second gas stream, and/or a third gas stream). Said carbon precursor hydrocarbon compound can also be introduced, in the form of an aerosol comprising finely divided liquid particles comprising a carbon precursor hydrocarbon compound (referred to here in what follows as "hydrocarbon aerosol"); in this latter case the hydrocarbon aerosol can be supplied in the same stream as the catalyst aerosol, or by another stream.

In any case the carbon precursor compound can comprise a single compound or several compounds. This is preferably hydrocarbons, but it can also contain for example carbon monoxide (CO).

In an embodiment, the precursor compound of a catalyst metal is ferrocene. Ferrocene having a melting point of about 172° C. and an evaporation point of about 250° C., it is suitable to dissolve it, preferably in toluene. The catalyst aerosol therefore comprises droplets of toluene in which the ferrocene is dissolved. The temperature T1 can be for example comprised between 0° C. and 50° C., and advantageously between 15° C. and 30° C. When the toluene evaporates (boiling point of about 110° C.) the ferrocene remains in the catalyst aerosol in the form of solid or liquid particles, or the mixture becomes a purely gaseous mixture, according to the temperature T2 of the zone of the reactor. By way of example T2 can be comprised between 120° C. and 450° C. and preferably between 250° C. and 450° C. Other solvents can be used, such as benzene or xylene.

It is known that ferrocene has a boiling (or evaporation) point of about 250° C.; the inventors do not think that the exact structure of the particles of the catalyst precursor in the catalyst aerosol is important for the present invention; according to the conducting of the method and in particular according to the temperatures T1 and T2 it is therefore possible that the catalyst aerosol changes structure between the moment when the catalyst precursor particles are injected into the carrier gas of the first gas stream and the moment when this gas stream arrives on the surface of the porous solid in the zone at the temperature T3. It is known that ferrocene decomposes around 450° C. into iron and cyclopentane, and in an advantageous embodiment the temperature T3 is at least equal to 450° C. By way of example T3 can be comprised between 450° C. and 700° C. This decomposition of the ferrocene can be carried out in the first gas stream and/or in contact with the porous substrate. According to an essential aspect of the invention the catalyst is deposited or is formed in the porous substrate or on the porous substrate in the form of nanoparticles.

A carbon precursor compound that can be catalytically decomposed by the nanoparticles of iron formed from particles of ferrocene is acetylene; the question of knowing whether or not the toluene of the catalyst aerosol is also decomposed depends substantially on the temperature. Acetylene can be the carrier gas of the catalyst aerosol.

Other molecules can be used as a catalyst precursor, for example cobaltocene, nickelocene, or a mixture of ferrocene and/or cobaltocene and/or nickelocene.

2. The Porous Substrate

Said catalyst precursor, preferably the catalyst aerosol, is conveyed by a carrier gas and forms the first gas stream; this stream is brought into contact with a porous substrate. This is a second essential characteristic of the method according to the invention. The substrate has to have the following characteristics: good resistance at a high temperature, a porosity that is open to reactive gases, good chemical inertia regarding reagents, good surface chemical affinity with the catalyst (in order to provide an adhesion that promotes the growth regime of carbon nanotubes or nanofibers by the base thereof, with this growth mechanism being known under the term "base growth mechanism", discussed hereinabove), and a low solubility of the catalyst in volume in order to limit the diffusion and deactivation of the catalytic particle.

The porous substrate must have in particular an open porosity that is sufficient to be able to be passed through by a gas stream. Said porous substrate can be a porous membrane.

The following substrates are suitable in particular, with the condition of having interconnected pores (in opposition to closed porosities):

porous silicon (which can be obtained by chemical etching of monocrystalline silicon using a suitable microlithographic mask; a membrane is thus obtained that has through-pores of a diameter of about a micrometer (typically between 0.7 µm and 3 µm, called "macroporous silicon"); if the chemical nature of the silicon is not suitable a thin layer of another material can be deposited, for example by electroplating);

porous alumina (which can be obtained by anodization of a sheet of aluminum then detaching of the layer of oxide from the substrate thereof; the anodic layer has columnar pores, parallel between them and perpendicular with respect to the substrate, of a diameter that is typically between 10 nm and 100 nm);

porous silicon carbide, in particular β silicon carbide and preferably in the form of foam;

metallic foams (for example aluminum foams);

carbon foams;

the VACNT (either self-borne or deposited onto a porous substrate; or hollow of which the central channel is filled with metal or metallic carbide);

mixed substrates (for example a nickel foam supported by a membrane of alumina).

As shall be explained in more detail hereinbelow, the non-metallic substrates that do not conduct electricity can be coated at least partially (and preferably in the zone close to the outlet surface thereof) with a metallic film in order to reinforce the effect of the localized heating by induction.

The bringing into contact of the catalyst or catalyst precursor with the porous substrate can be carried out in several ways.

In a first embodiment the first gas stream (comprising the catalyst precursor compound with the carrier gas thereof) is injected into said porous substrate that it passes through at least partially. In a second embodiment it is injected in the vicinity of said porous substrate, in particular in the vicinity of the outer surface thereof, via the exterior.

It is preferred that said first gas stream be injected into the porous substrate. Alternatively it can be injected into the reactor in the vicinity of the substrate, in particular over the outer surface thereof.

The method according to the invention has the particularity of simultaneously supplying all throughout the growth of the nanotubes the reaction medium with catalytic nanoparticles and with carbon precursor. In the methods according to prior art, the supplying of the catalyst and the supplying with carbon precursor are usually separated into two separate steps: in a first step catalytic particles are deposited onto the substrate or in the substrate, then in a second step the carbon nanotubes are made to grow by the supply of carbon precursor.

The inventors have discovered that the method according to the invention makes it possible to overcome the limitation of the length of the CNT by disappearance of the catalyst or loss of the catalytic activity thereof: this method makes it possible to constantly replace the catalyst that has become inactive or that has disappeared by disaggregation (i.e. progressively driven in the body of the nanotubes during the growth thereof). Indeed, the method according to the invention leads to carbon nanotubes that contain, spaced apart but present over the entire length of the tubes, nanoparticles of metallic catalyst (for example: iron) imprisoned in the central channel of the nanotube during the growth thereof: this is the signature of this method, stemming from the constant supply of catalyst in the form of an aerosol, that it shares with the method described in EP 1 515 911 B1 (see figure III-5 (a) of the thesis, mentioned hereinabove, of Sebastien Lagoutte, pages 117/118) which proves the constant supply of catalyst and the progressive disappearance thereof by incorporation into the nanotubes.

Without wanting to be bound by this theory, the inventors believe that the method according to the invention resolves a reaction mechanism problem that limits the potential of the methods according to prior art: when the length of the VACNT becomes greater than a certain limit (typically a few hundred micrometers or a few millimeters) the low diffusion of the precursors and of the by-products (of which the streams are opposed) blocks the access of the precursors to the catalytic sites and the access of the by-products to the surface of the mat of VACNT. In the method according to the invention the catalyst is renewed regularly, and the access of the reactive gases is spatially separated from the clearance of the by-products.

According to a particular embodiment, a mat of VACNT is used as a porous substrate; in an alternative a mat of VACNT is used of which the central channel comprises metallic particles (for example Fe or Ni or Co) or metallic carbide (for example Fe, Ni or Co carbide) coming from the catalyst produced with a continuous supply of catalyst by the periodic injection of a catalyst aerosol, knowing that the metallic particles or carbide that are inclusions in the central channel of the nanotubes make it possible to heat this substrate locally by induction.

3. The Localized Heating

A third essential characteristic is that the chemical vapor deposition is carried out in a localized zone of the porous substrate, which is preferably located at the downstream periphery thereof (with respect to the direction of the stream of carrier gas). The location of this zone can be defined by the effect of a localized heating at a temperature referred to as T3. It is in the heated zone that the catalyst precursor is decomposed in order to form nanoparticles of catalyst, and it is in this zone where the catalytic decomposition of the carbon precursor will take place. According to the value of the temperature T3 the decomposition of the catalyst precursor can begin upstream from this zone.

If the first gas stream does not comprise a carbon precursor compound, or if it is desired to supply another carbon precursor compound (or an additional quantity of said compound), a second gas stream comprising the carbon precursor compound must be injected as close as possible to this localized zone, and preferably in this localized zone. The injection of said second gas stream against the current of said first gas stream is to be avoided because it does not allow the secondary reaction products to be removed easily.

The confinement of the zone catalytic decomposition of the carbon precursor compound is an essential aspect of the method according to the invention. This confinement can be carried out by two means, which can be combined: by the localized heating of porous substrate to a temperature at least equal to T3, and by the localized injection of the stream of carbon precursor compound on or in the substrate (or a zone of said substrate) that is at a temperature at least equal to T3. In the two embodiments the confinement defines the heterogeneous catalyst zone from which the continuous growth of the carbon nanotubes or nanofibers is carried out, through the base thereof.

In a first embodiment it is the location of the energy supply that defines the heterogeneous catalyst zone. Several means of localized heating can be used. It is possible for example to selectively heat certain parts of the reaction zone and/or the porous substrate can participate in the heating (by itself becoming a heated part). This can for example be carried out by inductive heating, using a coil that surrounds at least partially the substrate and by judiciously choosing the materials that form the environment of the reaction zone. This is the preferred embodiment.

In induction heating, the zone to be heated is bathed in the oscillating magnetic field generated by a coil that surrounds said zone. In an embodiment a metallic part is positioned in the vicinity of the reaction (for example close to the outlet surface of the porous substrate), all of the other parts located in the zone of influence of the magnetic field applied being either non-metallic or made of an electrically-conductive material that has a lower resistivity than said metallic part. By way of example, the porous substrate can be made from a non-metallic material (for example of porous alumina), and a metallic foam that has open macropores can be affixed on the outlet surface of the non-metallic porous substrate (or positioned very close to this outlet surface). This is diagrammatically shown in FIG. 3(a), where the mark 31 designates said non-metallic porous substrate and the mark 32 said metallic foam. As shown in FIG. 3(b) it is also possible to use a metal ring 33 instead of the metallic foam, or in addition to the metallic foam (alternative not shown in the figures).

The localized energy supply can also be carried out by any suitable means, and in particular by resistive heating (Joule effect) of a resistance or of the porous substrate itself, even if these solutions are not the preferred solutions (the confinement of the heating is more difficult to control, and the connections become difficult to manage). The energy supply can also be carried out by laser irradiation, but this also is not the preferred solution (because the absorption coefficient of the surfaces can change during the synthesis due to surface deposition, and because space constraints for the optical path of the laser beam have to be taken into consideration).

The porous substrate can also be formed of carbon nanotubes, preferably aligned. When the porous substrate is formed of VACNT, the localized energy supply can also be carried out by inductive heating of the VACNT of which the central channel can possibly and advantageously comprise metallic particles or carbides of a metal, as was explained hereinabove.

The localized energy supply can also be carried out, at least partially, by inductive heating directly of the active catalytic particles for the synthesis of the carbon nanotubes. This solution is the one that allows for the most localized heating. It can be used alone, or preferably as a supplement to another means of heating, in particular in the case where it alone does not make it possible to form all of the energy supply required for the growth of the CNT.

To these means of localized heating can be added a preheating of said first and/or second gas streams.

The porous substrate (non metallic and insulating) can also be provided with a metallic coating so that only the surface thereof is heated by induction (for example an aluminum coating on a porous alumina).

The confinement of the energy supply can also be supplemented by the insertion of thermal barriers, for example comprised of layers with low heat conductivity close to the reactive zone (outlet surface of the porous substrate).

4. The Reactor

The heated substrate is in an enclosure, here called a "reactor", and the method advantageously takes place at a pressure close to the atmospheric pressure. This enclosure can be closed or partially closed but rendered sealed to the gas exchanges between the inside and the outside of the reactor. It comprises means for collecting the nanotubes formed. The enclosure can comprise means for heating the walls thereof, so as to prevent excessively high thermal gradients within the reactor. The reactor also comprises means for pumping, knowing that the gases entering into the reactor as well as the gases resulting from the method must be removed continuously. The reactor also comprises means for purging; purging can be carried out by rinsing using a neutral gas, whether or not associated with a steaming of the reactor prior to the starting of the method.

FIG. 4 diagrammatically shows three partial cross-section views of reactors that are suitable for the implementing of the method according to the invention. FIG. 4(a) shows the supply duct 41 with gas mixture 40 (with this gas mixture comprising the catalyst precursor and the carbon precursor) with the means of heating 42 that make it possible to reach a temperature T2 (defined hereinabove, for example a heating resistance that surrounds the supply duct), as well as the porous substrate 43 passed through by this gas stream. The means of localized heating 45 (for example a metal ring heated by an induction coil) that make it possible to reach a temperature T3 that is sufficient to allow for the catalytic growth of carbon nanotubes or nanofibers are located very close to the outlet surface 44 of the porous substrate 43. Downstream from the porous substrate 43 is located, optionally, a heating zone provided with means of heating that make it possible to heat the nanotubes or nanofibers to a temperature T4 that makes it possible to improve the crystallinity thereof. The condition T2<T3 must be satisfied.

Figure 4B:
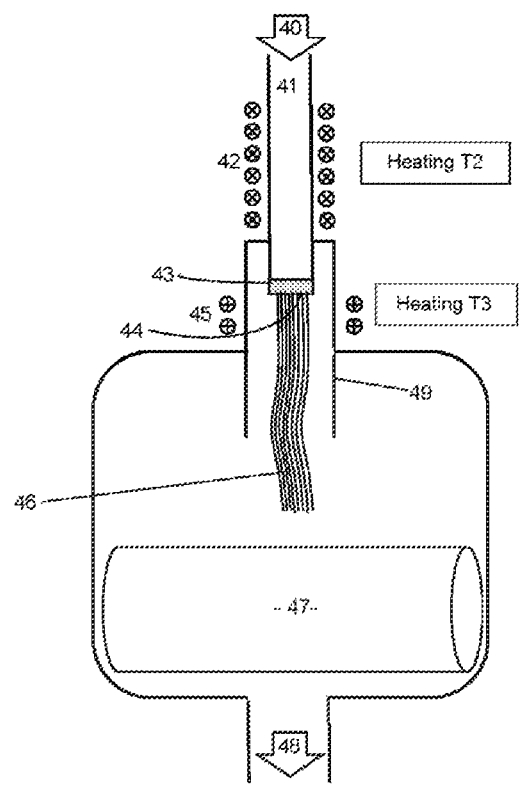

FIG. 4(b) shows the growth of the carbon nanotubes or nanofibers 46 that is deployed in a tubular deployment zone 49 located downstream from the porous substrate 43. If the reactor comprises the means for heating that make it possible to heat the nanotubes or nanofibers to a temperature T4, these means are advantageously located around this tubular deployment zone 49.

Figure 4C:
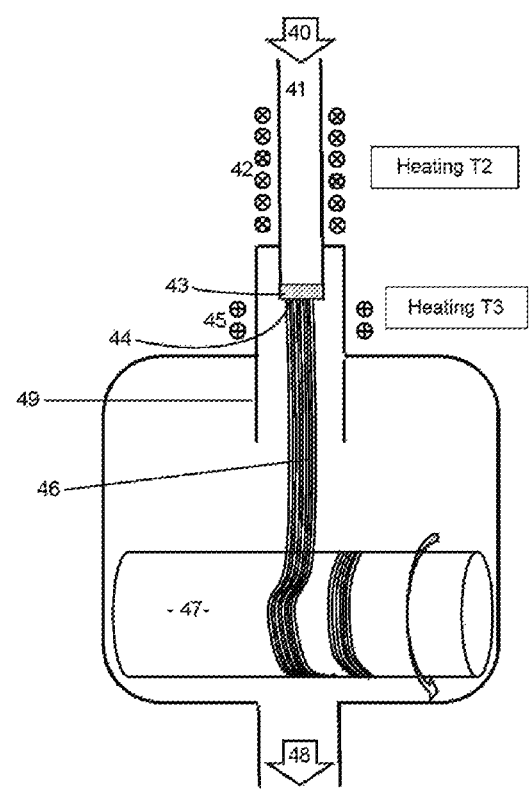

FIG. 4(c) shows a means 47 that makes it possible to wind the nanotubes or nanofibers. Any reaction gases that have not reacted, the carrier gases and the gaseous reaction products can exit the reactor through a discharge orifice 48. The pressure is advantageously close to the ambient pressure.

5. Alternatives Relating to the Injection of Reagents

In order to be able to precisely confine the reaction zone, it is desirable that the mixing of the gaseous chemical species and/or particles of the aerosol can be carried out locally, as close as possible to the targeted heterogeneous catalyst zone (reaction zone), i.e. as close as possible to the outlet surface of the porous substrate. Indeed, if the decomposition of the molecules of the reaction mixture takes place inside the porous substrate and if the temperature is not sufficiently confined (typically a temperature greater than 450° C.), the growth of the CNT will take place far from the surface of the porous substrate, which will inevitably result in a clogging of the pores and the stopping of the growth of the CNT.

The inventors found that it is possible to use coaxial injection heads, such as they are used in the field of the synthesis of fibers by electro-spinning: these coaxial injection heads make it possible in particular to confine the reactive gases without mixing them on a scale of a few millimeters; the outlet of the injection head can correspond to the inlet surface of the porous substrate.

In the case of the separate injection (for example coaxial) of the two gas streams, there are two extreme cases: (i) in a substrate with random porosity, the reactive gases will mix together progressively during the passing through of the porous substrate; if the temperature is not sufficiently confined near the outlet surface of the porous substrate, there is a risk of clogging of (some) pores; (ii) in a substrate with compartmentalized porosity (sealed channels), the reactive gases are mixed only at the outlet of the porous substrate, the pores do not clog but the reaction cannot take place on the surface of the substrate if the mixture is carried out only after having completely passed through the porous substrate.

Other intermediate cases can be considered, in particular the one of a forced stream on the surface of the porous substrate: a channel is dedicated to the pumping (extraction) of the reaction mixture, and the one where the reaction gases are mixed very close to the outlet surface but "below" the latter (multiple injector with intertwined channels, possibly associated with a porous substrate). Two of these embodiments are shown in FIG. 6. FIG. 6(a) shows an embodiment with a coaxial injection (shown as a longitudinal cross-section): a first gas stream 21 is injected into the porous substrate 64 reactor through a first peripheral tube 61, at the center of which there is a second tube 62 which injects the second gas stream 22. The two gas streams are mixed together in the porous substrate 64, and the growth of the carbon nanotubes 66 takes place on the surface of the substrate. FIG. 6(a) does not show the means for the confined heating that provides the temperature T4 required for the growth of carbon nanotubes.

FIG. 6(b) shows a more complex mode of injection derived from the one of FIG. 6(a) with a coaxial outer 61 and inner 62 tube and a coaxial peripheral tube 63 dedicated to the aspiration of the reaction mixture; the gas streams mix together when they are deviated in the aspiration tube 63. If no porous substrate is provided, the growth of the carbon nanotubes takes place on the edges (the section) of the tube 62 injecting the second gas stream 22; the coaxial tubes play in the case the role of a porous substrate with compartmentalized porosity. If a porous substrate is provided, the growth of the carbon nanotubes takes place on or in the vicinity of the outlet surface of the latter; in this embodiment the porous substrate is advantageously very thin (porous membrane).

6. General Characteristics of the Method, Advantages

FIG. 5 diagrammatically shows two embodiments of the method according to the invention.

Figure 5A:
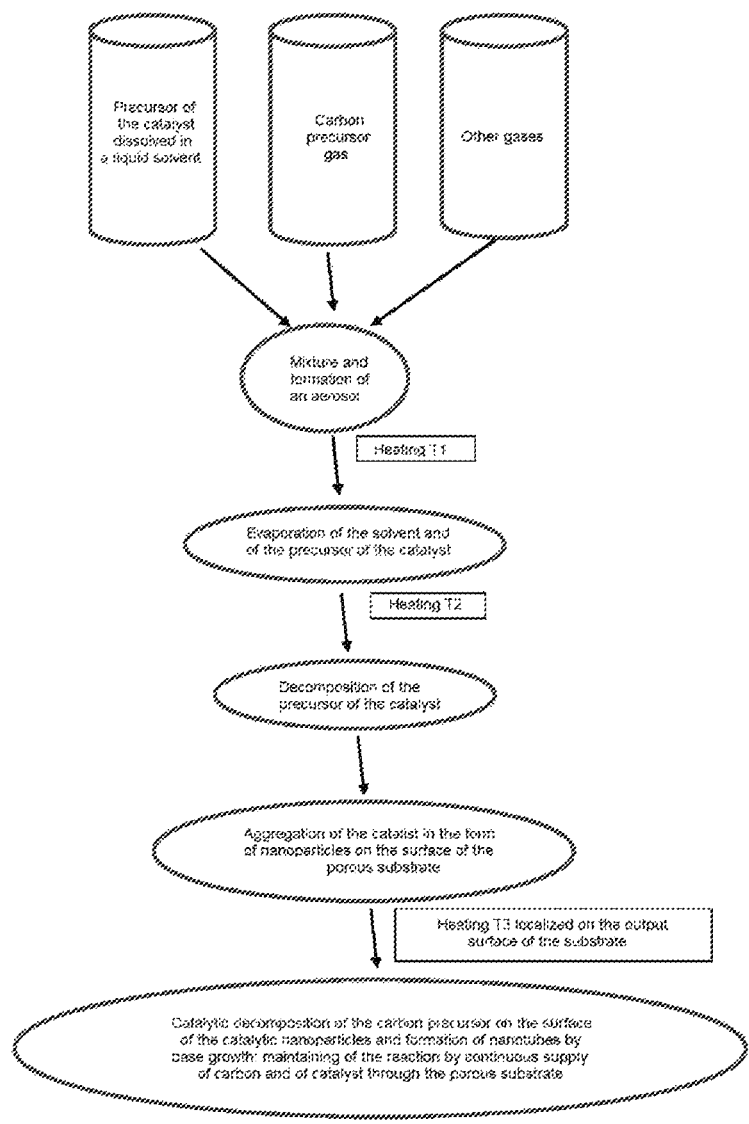

FIG. 5(a) shows an embodiment with localized heating to the temperature of catalytic decomposition of the carbon precursor, by one of the methods presented hereinabove in section 3. The precursor of the catalyst is dissolved in a liquid solvent. This can be for example ferrocene dissolved in toluene. An aerosol is formed that comprises particles (droplets) of this solution and a has phase as a carrier, said gas phase comprising the carbon precursor gas, which is a hydrocarbon, and said gas phase able to comprise other gases. This aerosol is heated to a first temperature T1, that is sufficient to allow for the evaporation of the solvent and of the catalyst precursor. This gas phase is heated to a second temperature T2, that is sufficient to allow for the decomposition of the precursor of the catalyst. This decomposition probably forms atoms of a suitable metal element, then metallic aggregates. By way of example, if the precursor of the catalyst is ferrocene atoms of iron are formed. These atoms aggregate and form metal nanoparticles on the surface of the porous substrate. (Note that in the framework of the present invention it is not important to know if the aggregation takes place in the gas phase or on the surface of the substrate). By the localized heating of a zone close to the outlet surface of the substrate to a third temperature T3 that is sufficient to allow for the catalytic growth of carbon nanotubes or nanofibers, the carbon precursor is allowed to catalytically decompose on the surface of the catalytic nanoparticles. This decomposition leads to the formation of carbon nanotubes through the base-growth mechanism, provided that there is a continuous supply of carbon freshly generated the decomposition of the carbon precursor, with this supply being carried out through the porous substrate.

Fresh catalyst nanoparticles are formed practically continuously, or at least periodically, by the continuous supply of atoms of metal that agglomerate to form new nanoparticles or that are added to the existing nanoparticles, with this supply being carried out through the porous substrate. Thus the growth of the carbon nanotubes is normally not interrupted, except for an accidental event of instability in the reaction conditions. In this embodiment the condition T1<T2<T3 must be satisfied.

Figure 5B:
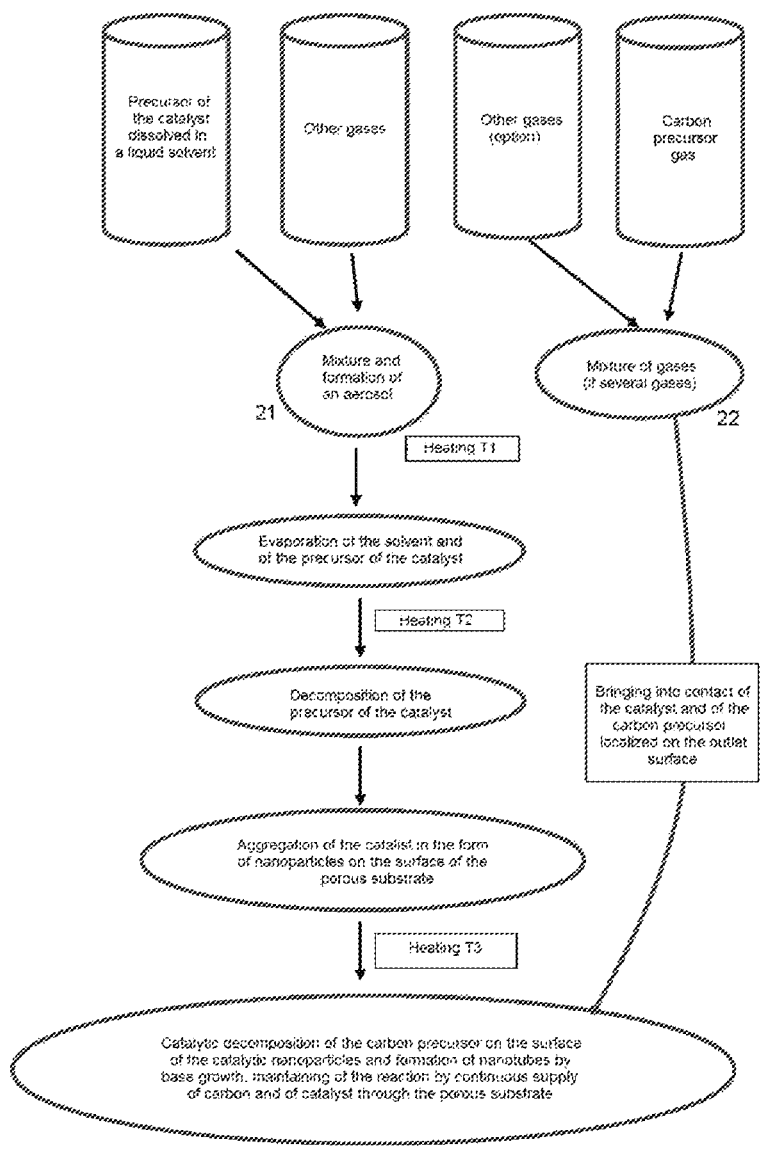

FIG. 5(b) shows another embodiment with the localized supply of the carbon precursor in the reaction zone heated to a temperature T3 that is sufficient to allow for the growth of carbon nanotubes or nanofibers. A first gas stream 21 is formed by the catalytic aerosol in a carrier gas (which can be a carbon source gas or, as indicated on the diagram, another gas). A second gas stream 22 is formed by a carbon precursor, possibly diluted in another gas. The precursor of the catalyst dissolved in the liquid solvent is mixed with another gas in order to form an aerosol, as in the embodiment of FIG. 5(a), which is heated to a first temperature T1 in order to evaporate the solvent and the catalyst precursor. This gas stream is heated to a second temperature T2, that is sufficient to allow for the decomposition of the precursor of the catalyst; the atoms of the metal of said precursor of the catalyst aggregate and form nanoparticles of metal on the surface of the porous substrate. As in the preceding embodiment, the substrate is heated to a third temperature T3 that is sufficient to allow for the growth of carbon nanotubes or nanofibers. The second gas stream 22 which comprises a carbon precursor gas, possibly mixed with another gas, is brought into contact with the catalyst located on the outlet surface of the porous substrate by a localized supply in the zone heated to said third temperature T3, in such a way that the catalytic decomposition of said carbon precursor in this zone leads to the formation of carbon nanotubes through the base-growth mechanism, provided that there is a continuous supply of carbon freshly generated the decomposition of the carbon precursor, with this supply being carried out locally. Fresh catalyst nanoparticles are formed practically continuously, or at least periodically, by the continuous supply of atoms of metal that agglomerate to form new nanoparticles or that are added to the existing nanoparticles, with this supply being carried out through the porous substrate. Thus the growth of the carbon nanotubes is normally not interrupted, except for an accidental event of instability in the reaction conditions. In this embodiment also the condition T1<T2<T3 must be satisfied.

In the two embodiments that have just been described, i.e. with localized heating to the temperature T3 or with localized supply of the carbon precursor in the zone heated to the temperature T3, a fourth heating zone to a fourth temperature T4 can be provided downstream from the growth zone of the nanotubes, in order to improve the crystallinity (i.e. the order on the atomic and nanometric scale) of the carbon nanotubes or nanofibers formed.

Without wanting to be bound by this theory, the inventors believe that the method according to the invention makes it possible to form in situ (i.e. on the porous surface of the substrate, and in the reaction zone) catalytic particles from the particles of the catalyst aerosol; indeed, these particles of a precursor compound of a catalyst are decomposed by pyrolysis in the heated localized zone of the porous substrate, and form metallic particles of nanometric size. In this same reaction zone the carbon precursor component conveyed, either in gas form or in the form of liquid particles, with the carrier gas or injected independently, is broken down under the catalytic effect of catalyst particles.

The method according to the invention would therefore be characterized by the fact that the supply with reagents is localized directly in the vicinity of the catalytic particles, and in the reaction zone. For this purpose a porous substrate is used that can play the role at the same time of mechanical support, catalyst regenerator and source of carbon precursor. In this preferred configuration the stream of reactant gases (catalyst and carbon precursor) is no longer opposed to the stream of by-products and a permanent supply-removal system can be established, independent of the length of the carbon nanotubes. This configuration is compatible with a growth of CNT that persists as long as the conditions for the supply with reagents and the removal of by-products are maintained in a stable manner, i.e. quasi-infinitely.

The method according to the invention allows for the growth of nanotubes and nanofibers of great length, with this growth taking place in the form of a bundle of parallel nanotubes or nanofibers; this facilitates the handling of the nanotubes or nanofibers obtained. By way of example, during the growth thereof they can be conveyed into a tube by directing the gas stream exiting from the reaction zone to this tube. By way of example, this tube can be made of metal or of quartz, and the end thereof can be located in the vicinity of the substrate (which can be a collection surface, for example the surface of a rotating roller), which makes it possible to receive, to direct and to protect the bundle of nanotubes or nanofibers obtained.

These nanotubes and nanofibers show a very low number of interfaces or crystal boundaries over the length thereof, or are even exempt from such interfaces or boundaries; these interfaces and boundaries can be highlighted by different analysis techniques known to those skilled in the art, and in any case by par transmission electron microscopy.

The invention claimed is:

1. A method comprising:
   preparing carbon nanotubes, nanofibers or nanofilaments,
      wherein the preparing comprises decomposing at least one carbon precursor in the presence of a catalyst, and
      wherein the preparing further comprises:
         bringing a first gas stream comprising a precursor of a catalyst into contact with a porous substrate so that:
            the first gas stream is at least partially passed through the substrate, or
            the first gas stream is directed on a surface zone of the porous substrate;
         bringing a second gas stream including at least one carbon precursor into contact with said porous substrate; and
         heating the porous substrate to a first temperature leading to the deposition of catalyst particles and to the catalytic growth of carbon nanotubes
            wherein the porous substrate is heated locally in a zone through which the first gas stream leaves the substrate, or in the surface zone on which the first gas stream is directed.

2. The method according to claim 1, wherein the first gas stream and the second gas stream comprise the same gas stream mixture.

3. The method according to claim 1, wherein the localized heating is carried out by electromagnetic induction.

4. The method according to claim 3, wherein the localized heating is carried out, at least partially, by inductive heating of the catalyst particles.

5. The method according to claim 1, wherein the carbon precursor is a hydrocarbon.

6. The method according to claim 1, wherein the first gas stream is generated from an aerosol including a metallo-organic compound in a carrier gas.

7. The method according to claim 6, wherein the aerosol is generated by periodic injection of a liquid phase comprising the metallo-organic compound in a carrier gas.

8. The method according to claim 6, wherein the metallo-organic compound is selected from the group comprising ferrocene, cobaltocene or nickelocene.

9. The method according to claim 1, wherein the porous substrate is a porous membrane.

10. The method according to claim 1, wherein the porous substrate comprises: a porous silicon, a porous alumina, a porous silicon carbide, a metallic foam comprising interconnected pores, a carbon foam comprising interconnected pores, vertically aligned carbon nanotubes, or a combination thereof.

* * * * *